United States Patent [19]
Llewellyn

[11] Patent Number: 5,579,352
[45] Date of Patent: Nov. 26, 1996

[54] SIMPLIFIED WINDOW DE-SKEWING IN A SERIAL DATA RECEIVER

[75] Inventor: William D. Llewellyn, San Jose, Calif.

[73] Assignee: National Semiconductor Corporation, Santa Clara, Calif.

[21] Appl. No.: 223,619

[22] Filed: Apr. 6, 1994

[51] Int. Cl.⁶ .................................................. H03D 3/24
[52] U.S. Cl. ......................... 375/376; 375/326; 375/328; 371/1; 327/144
[58] Field of Search ................................ 375/106, 110, 375/120, 324, 326, 327, 328, 333, 355, 374, 376; 371/1; 327/141, 144, 147, 148, 149, 155, 156, 157, 158; 326/54

[56] References Cited

U.S. PATENT DOCUMENTS

| | | | |
|---|---|---|---|
| 4,700,347 | 10/1987 | Rettberg et al. | 371/1 |
| 4,773,083 | 9/1988 | Baumbach et al. | 375/328 |
| 5,040,193 | 8/1991 | Leonowich et al. | 375/333 |
| 5,123,030 | 6/1992 | Kazawa et al. | 375/120 |
| 5,164,966 | 11/1992 | Hershberger | 375/110 |
| 5,341,405 | 8/1994 | Mallard, Jr. | 371/1 |
| 5,373,535 | 12/1994 | Ellis et al. | 371/1 |

Primary Examiner—Stephen Chin
Assistant Examiner—Amanda T. Le
Attorney, Agent, or Firm—Skjerven, Morrill, MacPherson, Franklin & Friel; David E. Steuber; Arthur J. Behiel

[57] ABSTRACT

A serial data receiver includes a clock recovery circuit, a data latch, and a selectable clock inversion mechanism coupled between the clock recovery circuit and the data latch. In one embodiment, the selectable clock inversion mechanism includes an XNOR gate. If a high signal is provided to the XNOR gate, the XNOR gate provides the signal on a recovered clock line to the data latch, thereby placing the window boundaries coincident with, or very near, the rising edges of the input data pulses. The variable phase between these signals is then adjusted for the maximum coincidence of data pulses with the window boundaries. Then, a low signal is provided to the XNOR gate, thereby providing the true signal on the recovered clock line to the data latch. Assuming the symmetry of the recovered clock is truly 50/50, the window moves by exactly 180 degrees. In this manner, the data bits' mean position falls precisely in center of the window, thereby providing substantially ideal window symmetry with minimal phase adjustment and significantly reduced calibration time.

21 Claims, 5 Drawing Sheets

SIMPLIFIED WINDOW DE-SKEWING IN A SERIAL DATA RECEIVER

BACKGROUND OF THE INVENTION

1. Field of the Invention

The present invention relates to a serial data receiver, and in particular to a serial data receiver that includes a mechanism to de-skew, i.e. center, the time position of the data bit capture window in an end-use environment.

2. Description of the Related Art

Disk and tape storage systems as well as communication networks typically pass data in serial fashion across a medium interface. FIG. 1 represents a conventional clock extraction method herein referred to as the sprocket concept of clock recovery. In this method, data 100 arrives asynchronously and without a separate clock signal for processing the data. Clock extraction circuitry, for example a phase-locked loop (PLL), recovers a continuous, periodic clock waveform 101 from discontinuous data 100. Recovered clock waveform 101 is represented as a gear having teeth and troughs 101A–101F. Troughs 101A, 101C, and 101F interdigitize with the logic one data bits 100A, 100B, and 100C, respectively. Troughs 101B, 101D, and 101E correspond to the logic zeros on waveform 100.

The clock extraction circuitry serves to maintain the alignment (phase) of the troughs (windows) to the sprocket teeth (data pulses or logic ones), thereby extracting a continuous clock waveform with precise frequency and correct average phase alignment from the discontinuous and jittery serial data reference. Recovered clock waveform 101 is used to re-time the often jittery data pulses from which it was extracted to provide a time-stabilized, quantized (i.e. windowed), reconstructed data stream. The re-timed data and extracted clock are then provided to other circuitry downstream for processing such as deserialization or decoding.

A window is a repeating time cell defined by the period of the recovered clock and is used to standardize the time positions of incoming data bits. For example, FIG. 2 illustrates time line 200 along which data bits 201A–201F may occur within windows 202A–202F, respectively. The horizontal axis represents the time position of each pulse arrival and the vertical axis represents the probability of each pulse. The symmetry of windows 202A–202F is critical in minimizing bit errors. Specifically, if a window is truly symmetrical about the mean bit position, data bits 201A–201F are free to jitter within windows 202A–202F, respectively, by 50% of the window width in either direction while still being detected, i.e. received, properly. However, if the window position is skewed, i.e. asymmetrical, jittered bits which are displaced toward a boundary 203 of a window 202, for example, will more readily cross boundary 203 and fall into an adjacent detection window, thereby creating bit errors.

If the skew is systematic, i.e. highly repeatable from one data receiver to the next receiver, the skew can be eliminated by design. However, random variances between receivers leave undesirable, uncompensated skew. Under some circumstances, skew can be eliminated on a chip-by-chip basis by trimming. However, because trimming is performed in the integrated circuit manufacturing environment, and not in its end-use environment, some non-compensated skew effects remain.

FIG. 3 shows a serial data receiver 315 that includes a PLL 300 and a data latch 307. PLL 300 includes a phase detector 303, a low pass filter (LPF) 304, and a voltage controlled oscillator (VCO) 305. Phase detector 303 detects two input frequencies: one frequency provided to the positive input terminal of phase detector 303 by delay 301 (from raw data line 306) via line 301A and the other frequency provided to the negative input terminal of phase detector 303 by pulse gate 302 (from recovered clock line 313). Phase detector 303 generates an output phase-error signal that is determined by the phase difference between these two frequencies. The function of pulse gate 302 is to allow one feedback pulse from VCO 305 to be provided to the negative input terminal of phase detector 303 for each pulse on raw data line 306, and otherwise to block feedback pulses from VCO 305 in the absence of pulses on raw data line 306. This allows PLL 300 to maintain a block of its continuous signal on recovered clock line 313 to the discontinuous signals on its raw data line 306.

If the phase on raw data line 306 does not equal the phase on recovered clock line 313, the phase-error signal, after being filtered by LPF 304, causes the phase of VCO 305 to deviate in the direction of the phase on raw data line 306. If PLL 300 is properly designed, VCO 305 locks to the base clock frequency on raw data line 306 (the base clock frequency is the frequency the raw data would exhibit if every available bit position in the data stream had a pulse in it —ultimately equivalent to the frequency of the signal on recovered clock line 313) and ignores the missing pulses of the random data. PLL 300 is described in further detail in U.S. Pat. No. 5,172,397, which is herein incorporated by reference in its entirety.

The recovered clock is configured to have precise symmetry (i.e. 50% duty cycle), such that the average incoming data pulses on raw data line 306 fall exactly half-way in between predetermined (e.g. falling) clock edges on recovered clock line 313. Typically, this symmetry is achieved by operating VCO 305 at twice the desired clock frequency and employing it to clock a differential flip-flop in a toggle configuration.

PLL 300, using the above-described technique, subsequently referred to as clock symmetry-based windowing, minimizes skew in data windows for bit capture and transmittal by data latch 307. Fine de-skewing is achieved by feeding data latch 307 from a secondary delay line 301B, wherein the delay associated with 301B is nominally equal to that of the delay provided on line 301A, but can be shortened or lengthened as desired for window adjustment. This fine de-skewing is further described in U.S. Pat. No. 5,097,489, which is incorporated by reference in its entirety.

FIG. 4 shows serial data receiver 415 having a configuration similar to that of serial data receiver 315 (FIG. 3) except that raw data is fed directly to data latch 407 and the recovered clock signal on line 413, which is provided to flip-flops 409 and 410 of data latch 407, is not inverted (i.e. an inverter 311 of data latch 307 is eliminated (FIG. 3)). In this receiver configuration, delay 401 (instead of clock inversion) provides the necessary 180 degree phase shift between the raw data on line 406 and the recovered clock on line 413 to produce the data window. The magnitude of the delay associated with delay 401 is variable to allow for window adjustment for de-skewing purposes. This technique is referred to as delay line-based windowing.

FIG. 5 shows serial data receiver 515 also having a configuration similar to that of receiver 315 (FIG. 3) except phase detector 503 includes a pump 521 which provides a variable ratio of pump-up versus pump-down currents. Pump 521 produces a variable phase shift between the signals provided on its positive and negative input terminals.

This shift is proportional to the up/down pumping current ratio. Thus, in this manner, the controlled phase shift adjusts, i.e. de-skews, the data window position. This technique is referred to as phase detector offset-based windowing.

However, serial data receivers 315, 415, and 515 all require significant window shifting to ascertain the position of the window edges as indicated by the bit error rate (BER). Specifically, to de-skew, the window is first shifted in one direction by the shifting means employed in that particular circuit until the BER crosses some pre-determined threshold. The same is done with a shift in the opposite direction. A mean position between the BER thresholds is then calculated and the window is shifted to that position.

This shifting method has numerous disadvantages:

1. The large amounts of window shifting required to reach the BER threshold entail associated circuit complexity, thereby increasing die area and power consumption.

2. The resolution of the window shift mechanism must be high through its entire shifting range since it is not known where the BER threshold will be encountered. Thus, once again, undesirable circuit complexity is required, thereby introducing an associated power penalty.

3. In some systems, such as in serial data receiver 515 (FIG. 5), pump 521 interferes with the equilibrium of PLL 500 since pump 521 skews the servo feedback mechanism of PLL 500 in order to move the data window. Thus, any bit detection errors, including those errors occurring during window de-skewing, simultaneously produce phase correction errors in PLL 500. These phase correction errors are undesirable, especially in demanding, low-margin (low SNR or high jitter) environments, such as disk storage systems.

Thus, a need exists for a simple, effective means to de-skew the data receiver window on a device-per-device basis while the serial data receiver is operating in its end-use environment.

SUMMARY OF THE PRESENT INVENTION

In accordance with the present invention, a serial data receiver includes a clock recovery circuit, a data latch, and a selectable clock inversion device coupled between the clock recovery circuit and the data latch. In one embodiment, the selectable clock inversion device includes an exclusive NOR gate. In other embodiments, the selectable clock inversion device includes an exclusive OR gate, or a two input multiplexer in which one input terminal includes an inverter.

If a de-skew mode signal of a first logic state is provided to the selectable clock inversion device, the device provides the signal on a recovered clock line to the data latch, thereby placing the window boundaries coincident with, or very near, the rising edges of the delayed raw data signals. The variable phase relationship between these signals is then adjusted for the maximum coincidence of data pulses with the window boundaries. This data/boundary coincidence is achieved by observation of the bit error rate (BER) of the signals on the synchronized data output line of the data latch, which should be at or near one error for every two bits. Because an un-inverted clock signal places the window boundary so close to the rising edges of the signals on delayed data line, virtually no further displacement of the window is necessary to reach the 50% BER point.

The amount of window shift needed for this point is "remembered" and fixed using conventional methods. Then, the de-skew mode signal is switched to a second logic state, thereby inverting the signal on the recovered clock line. Assuming the symmetry of the recovered clock is truly 50/50, the window moves by exactly 180 degrees. In this manner, the data bits' mean position falls precisely in center of the window, thereby providing substantially ideal window symmetry and corresponding minimized bit error rate.

Thus, a data serial receiver in accordance with the present invention requires only a minimal shift/search range in determining the ideal de-skewed position, thereby saving valuable measurement time which increases production line throughput. Moreover, the present invention accelerates window de-skew by allowing use of the 50% error rate decision point using many bit errors per second rather than prior art receivers which use only a few bit errors per second. Furthermore, the present invention decreases circuit complexity in comparison to prior art serial receivers, thereby significantly reducing IC die size and lowering power consumption.

DETAILED DESCRIPTION OF THE DRAWINGS

Figure 1:
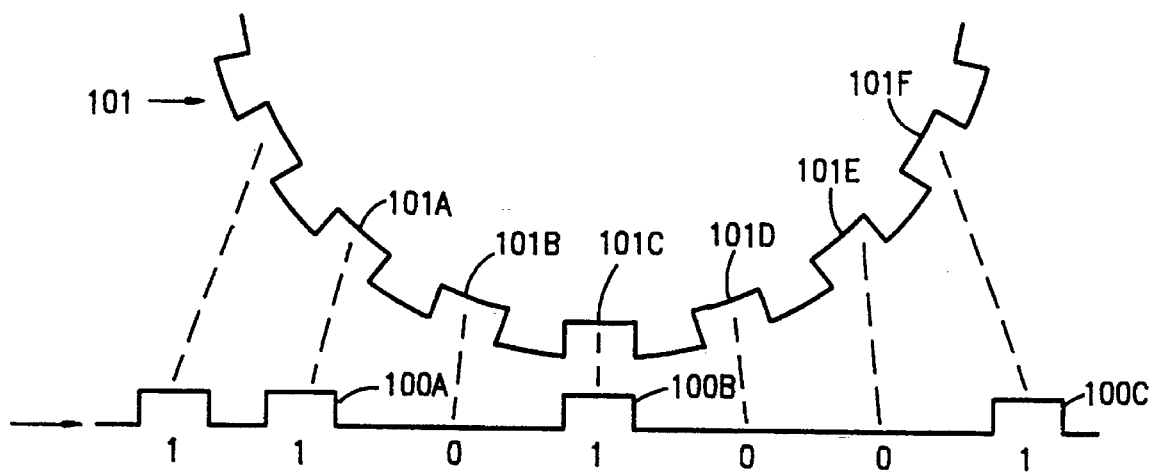
FIG. 1 illustrates the sprocket theory of clock recovery.
Figure 2:
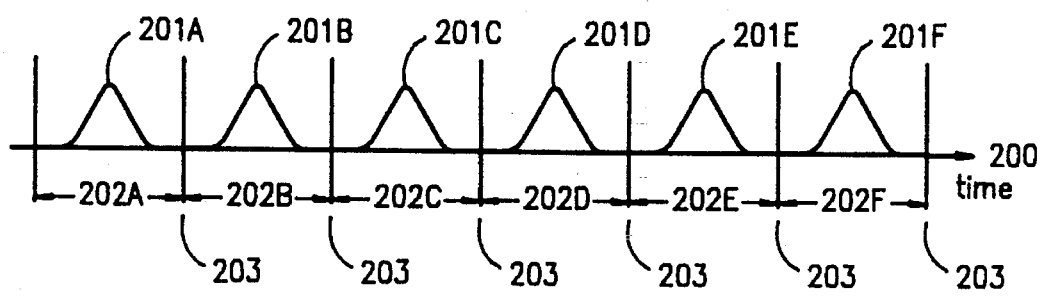
FIG. 2 shows the distribution of data bits between window boundaries along a time line.
Figure 3:
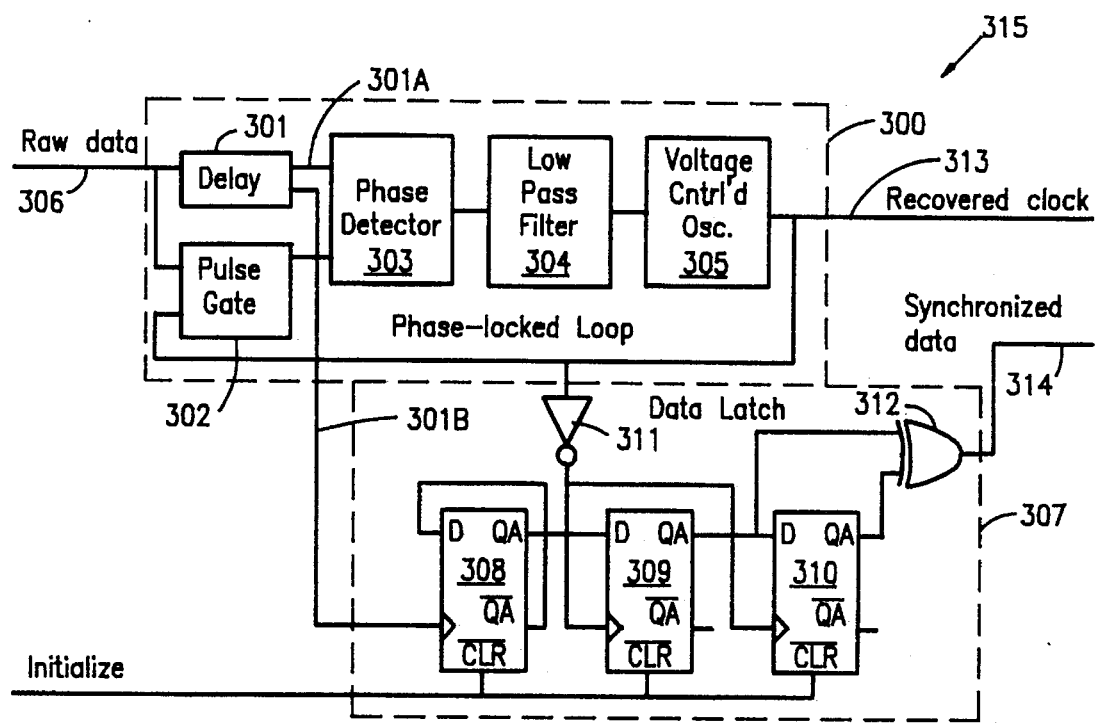
FIG. 3 illustrates a conventional serial data receiver configured for clock symmetry-based windowing.
Figure 4:
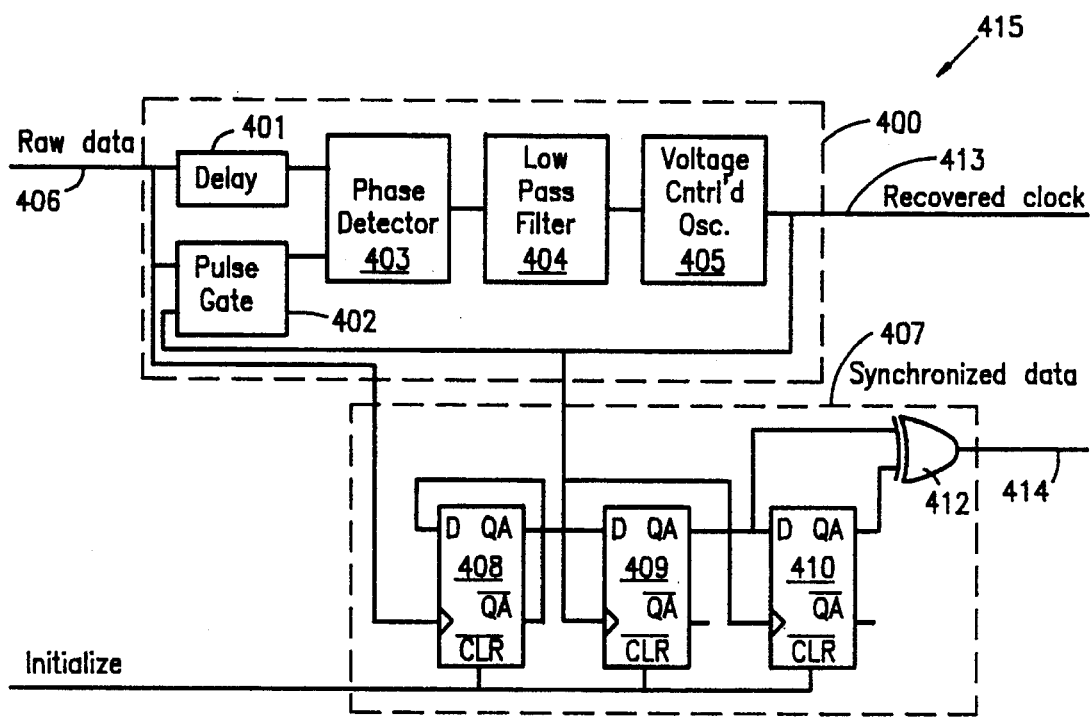
FIG. 4 shows another conventional serial data receiver configured for delay line-based windowing.
Figure 6:
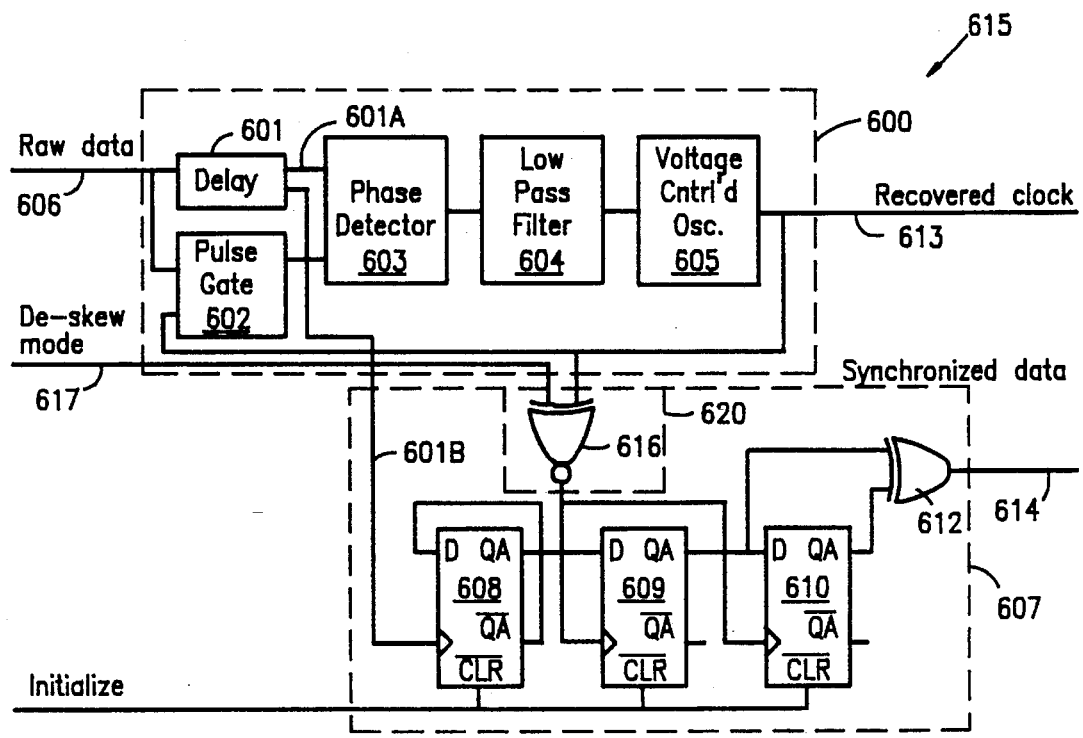
FIG. 6 shows a serial data receiver in accordance with the present invention.
Figure 7:
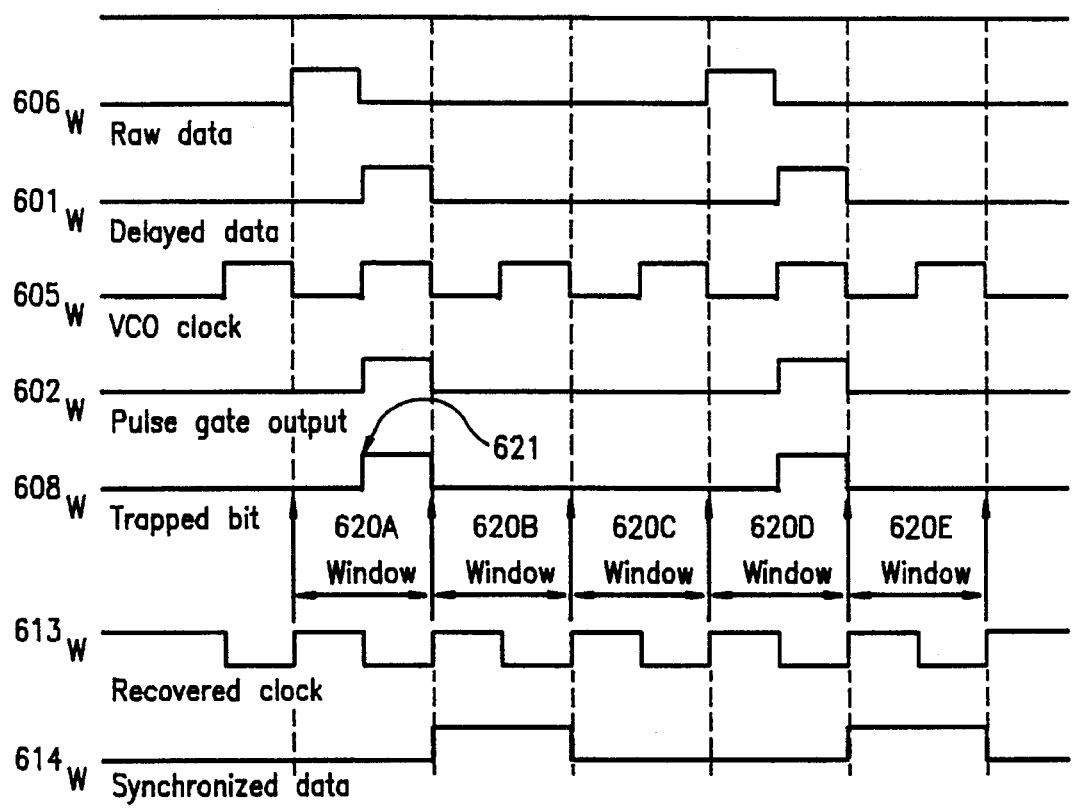
FIG. 7 illustrates various waveforms provided by the serial data receiver in the present invention in a normal mode.

FIG. 6 illustrates a serial data receiver 615 in accordance with the present invention. Receiver 615 includes a clock recovery circuit, i.e. PLL 600, and data latch 607 which are substantially identical to PLL 300 and data latch 307 (FIG. 3). Thus, PLL 600 maintains a local clock with stable phase centered about the average delayed bit position which is indicated by edge 621 of waveform $608_w$ (FIG. 7). However, in the present invention, inverter 311 (FIG. 3) is replaced by a mechanism 620 for selectively inverting the signal on recovered clock line 613.

In this embodiment, the mechanism 620 for selectively inverting is an XNOR gate 616. This XNOR gate 616 allows for selective control of the state, i.e. inverted or non-inverted state, of the signal from recovered clock line 613 as applied to the clock input terminals of flip flops 609 and 610. In normal window operation, the signal on de-skew mode line 617 is a logic zero, thereby ensuring that XNOR gate 616 provides an inverted recovered clock signal to data latch 607.

Data latch 607 is further provided raw, unsynchronized data bits on line 601B (waveform $601_w$ in FIG. 7). In data latch 607, flip-flop 608 is toggled with the rising edges of the input data bits provided on line 601B. In the absence of any input data, the signals on all the Q-output terminals of flip-flops 608, 609, and 610 are in the same logic state. For simplicity, assume all flip-flops have logic zero signals on their Q-output terminals. An incoming data bit on line 601B toggles the signal of the Q-output terminal of flip-flop 608 to a logic one. A rising clock edge provided by XNOR gate 616 sets the signal on the Q-output terminal of flip-flop 609 to a logic one. Thus, flip-flops 609 and 610 now have signals of opposite logic states on their Q-output terminals. These signals are in turn provided to the two input terminals of XOR gate 612. With these input signals, XOR gate 612 transmits a logic one signal on output line 614 (waveform $614_w$ in FIG. 7), thereby initiating a synchronized data output pulse.

The next clock edge clocks the signal on the Q-output terminal of flip-flop 610 to a logic one. Because both input signals to XOR gate 612 are logic ones, XOR gate 612 provides a logic zero output signal on line 614, thereby terminating the synchronized data pulse.

FIG. 7 shows other waveforms provided by serial data receiver 615 (FIG. 6) in its normal operation mode. These waveforms include: raw data waveform $606_w$ provided by raw data line 606, VCO clock waveform $605_w$ provided by VCO 605, pulse gate waveform $602_w$ provided by pulse gate 602, trapped bit waveform $608_w$ provided by flip-flop 608, and inverted recovered clock waveform $613_w$ provided at the output of XNOR gate 616.

Figure 8:
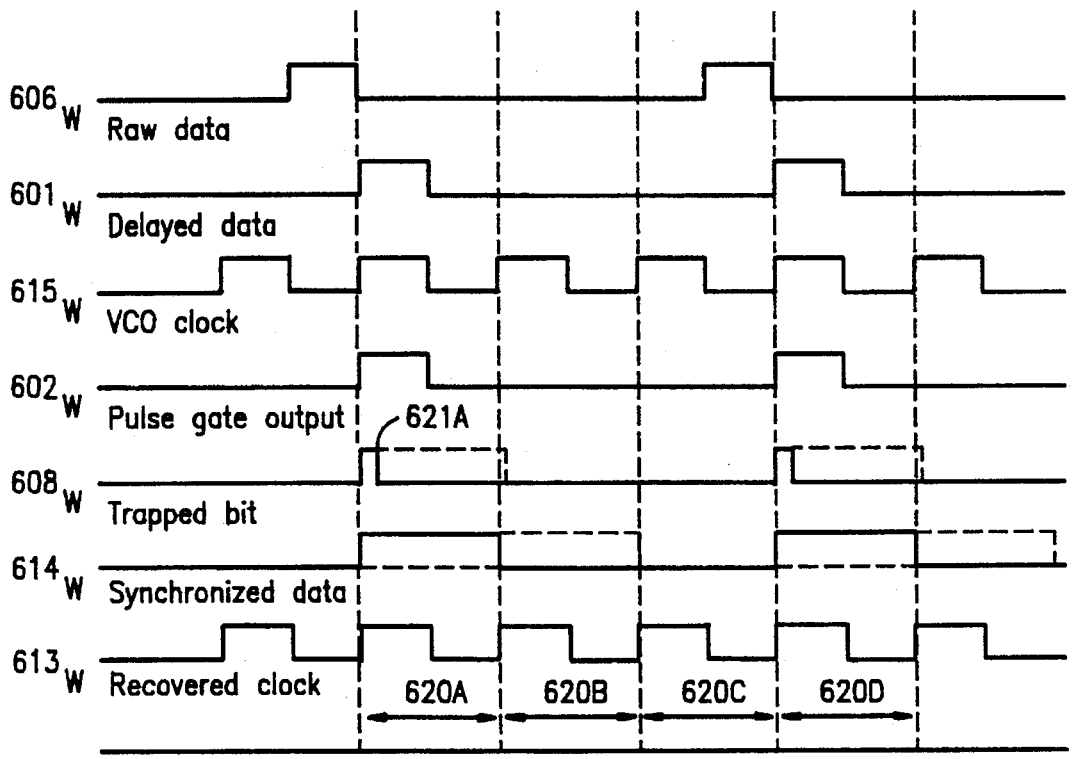
FIG. 8 shows various waveforms provided by the serial data receiver in the present invention in a window de-skewing mode.

If the de-skew mode signal on line 617 is taken high, XNOR gate 616 provides an uninverted recovered clock waveform $613_w$ to flip-flops 609 and 610, thereby placing the window boundaries 620A coincident with, or very near, the rising edges of the signals on delay line 601B (waveform $601_w$ in FIG. 8). The variable delay of delay 601 (provided via line 601B) is then adjusted for the maximum coincidence of data pulses (waveform $601_w$) with boundaries of windows 620A.

This data/boundary coincidence is easily achieved by observation of the bit error rate (BER) of the signals on synchronized data output line 614 (waveform $614_w$ shown in FIG. 8), which should be at or near one error for every two bits. Because an un-inverted clock signal places the leading boundary or window 620A so close to the rising edges of the signals on delayed data waveform $601_w$, virtually no further displacement of window 620A is necessary to reach the 50% BER point. The solid and dashed lines represent the two possible positions of each of the synchronized data output pulses given that the input data pulses, in the de-skew mode, occur almost exactly on the window boundaries. If the input pulse is exactly on the window boundary, then either output pulse (solid or dashed) is equally likely.

The amount of window shift needed for this point is "remembered" and fixed using conventional methods. Then, the de-skew mode signal on line 617 is returned to a logic zero, thereby re-inverting the signal from recovered clock line 613. Assuming the symmetry of the recovered clock is truly 50/50, window 620A moves by exactly 180 degrees. In this manner, the data bits' mean position falls precisely in center of window 620A, thereby providing substantially ideal window symmetry and corresponding minimized bit error rate.

Figure 5:
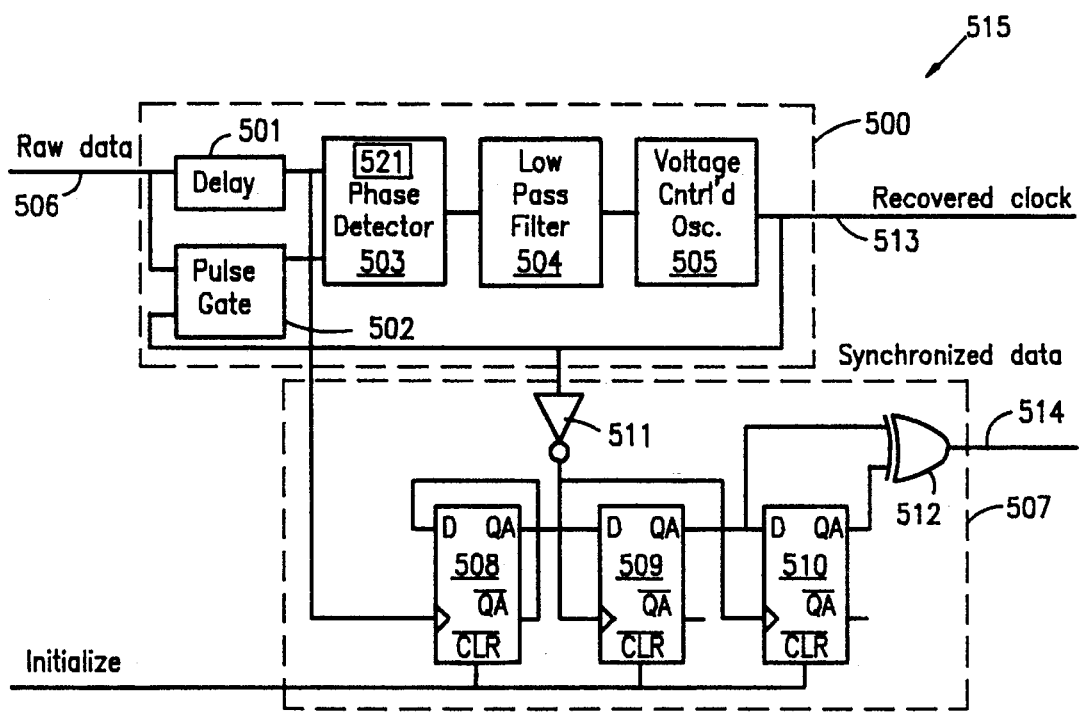
FIG. 5 illustrates yet another conventional serial data receiver configured for phase detector offset-based windowing.
Figure 9:
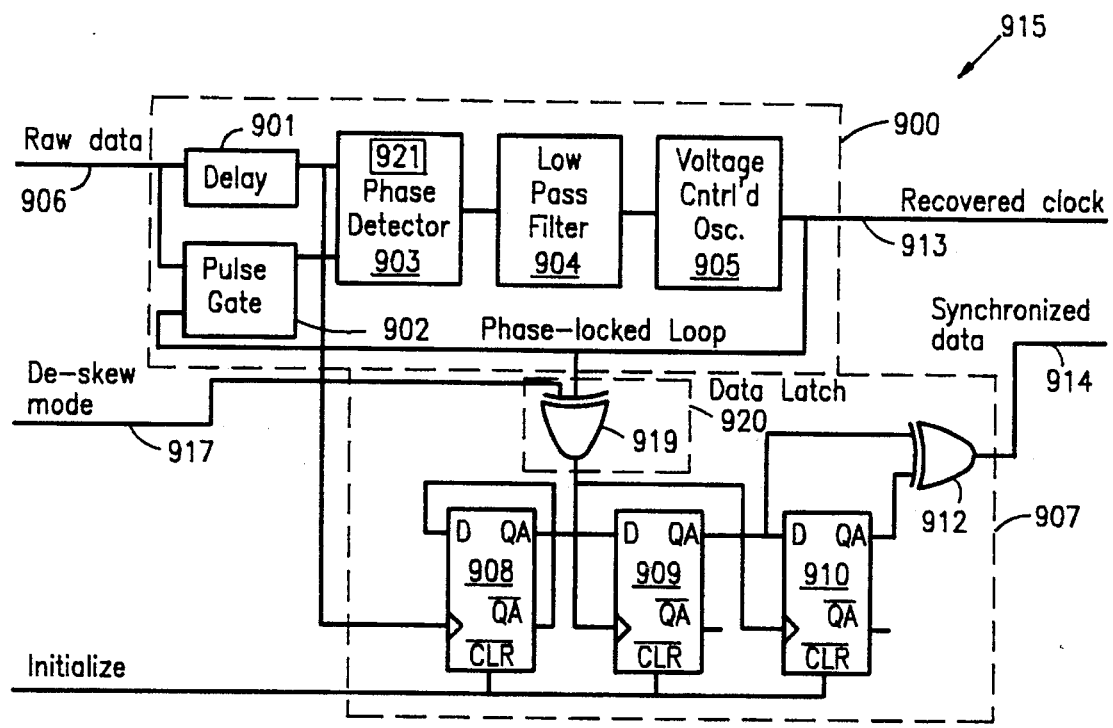
FIG. 9 illustrates another embodiment of a serial data receiver in accordance with the present invention.

The selective clock inversion technique for window de-skewing is not limited to the clock symmetry-based win-dowing data receiver of FIG. 6. Specifically, the present invention is equally applicable to other receiver configurations. For example, FIG. 9 illustrates another embodiment of the present invention in which mechanism 920 for selectively inverting is included in a serial data receiver 915 configured to provide phase detector offset-based windowing. In this embodiment, XNOR gate 616 (FIG. 6) is replaced by XOR gate 919. Note that although receiver 915 involves the servo loop of PLL 900 for window shifting, the very small amount of shifting needed to de-skew while employing a selectively inverted data latch clock leaves PLL 900 relatively undisturbed, thereby avoiding the phase correction errors previously mentioned in reference to serial data receiver 515 (FIG. 5).

Figure 10:
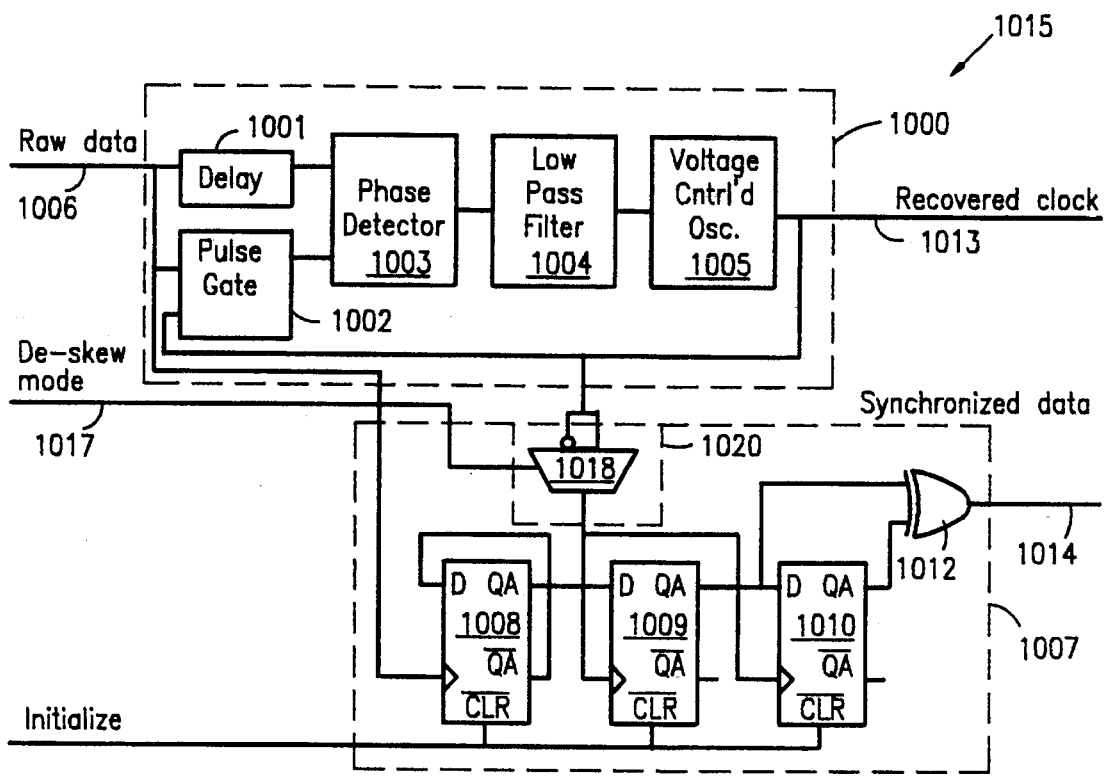
FIG. 10 illustrates yet another embodiment of a serial data receiver in accordance with the present invention.

FIG. 10 shows yet another embodiment of the present invention in which mechanism 1020 for selectively inverting is included in a serial data receiver 1015 configured to provide delay line-based windowing. In this embodiment, XNOR gate 616 (FIG. 6) is replaced by a two input multiplexer 1018, wherein one input terminal is inverting and the other input terminal is noninverting. To ensure optimal window symmetry in multiplexer 1018, the delay provided by the non-inverting path must be substantially equivalent to the delay provided by inverting path. Note that in FIGS. 3, 4, 5, 6, 9, and 10, identical components have the same last two digits in their reference numerals. Thus, for example, low pass filter 304 (FIG. 3) is identical to filters 404, 504, 604, 904, and 1004 (FIGS. 4, 5, 6, 9 and 10, respectively).

A data serial receiver in accordance with the present invention provides the following advantages over prior art receivers.

1. The present invention requires only a minimal shift/search range in determining the ideal de-skewed position, thereby saving valuable measurement time which increases production line throughput.

2. The present invention accelerates window de-skew by allowing use of the 50% error rate decision point using many bit errors per second rather than prior art receivers which use only a few bit errors per second.

3. The present invention decreases circuit complexity, thereby significantly reducing IC die size and lowering power consumption.

The detailed description above is illustrative only and not limiting. For example, in other embodiments of the present invention, XNOR gate 616, XOR gate 919, and multiplexer 1018 are interchangeable in the serial data receiver configurations shown in FIGS. 6, 9 and 10. Those skilled in the art will recognize other embodiments of the present invention. The present invention is set forth in the claims.

I claim:

1. A serial data receiver for extracting synchronized data from a binary input signal, said receiver comprising:

a clock recovery circuit extracting a recovered clock signal from said binary input signal;

a data latch providing a synchronized data signal; and a switching mechanism selectively providing said recovered clock signal to said data latch in a de-skew mode or an inverted recovered clock signal to said data latch in a normal operation mode, said mechanism comprising a recovered clock input for receiving said recovered clock signal from said clock recovery circuit, a select input receiving a select signal, and an output coupled to said data latch;

wherein said select signal on said select input determines which of said recovered clock signal or said inverted recovered clock signal is provided to said data latch.

2. The serial data receiver of claim 1 wherein said clock recovery circuit includes a phase-locked loop (PLL).

3. The serial data receiver of claim 2 wherein said phase locked loop includes means for deskewing a window.

4. The serial data receiver of claim 3 wherein said means for deskewing a window includes a charge-pump-based phase detector.

5. The serial data receiver of claim 1 wherein said mechanism includes a logic gate.

6. The serial data receiver of claim 5 wherein said logic gate is an exclusive NOR gate.

7. The serial data receiver of claim 5 wherein said logic gate is an exclusive OR gate.

8. The serial data receiver of claim 1 wherein said mechanism includes a two input multiplexer, wherein one input terminal inverts a signal.

9. The serial data receiver of claim 1 wherein said serial data receiver provides clock symmetry-based window centering.

10. The serial data receiver of claim 1 wherein said serial data receiver provides delay line-based window centering.

11. A serial data receiver for providing synchronized data from a binary input signal, said receiver comprising:

a clock recovery circuit extracting a recovered clock signal from said binary input signal;

a data latch providing a synchronized data signal; and means for selectively providing said recovered clock signal to said data latch in a de-skew mode or an inverted recovered clock signal to said data latch in a normal operation mode, said means comprising a recovered clock input for receiving said recovered clock signal from said clock recovery circuit, a select input receiving a select signal, and an output coupled to said data latch;

wherein said select signal on said select input determines whether said means provides said recovered clock signal or said inverted recovered clock signal to said data latch.

12. The serial data receiver of claim 11 wherein said data latch includes a plurality of flip-flops, wherein a first flip-flop receives a delayed data signal, and a second flip-flop and a third flip-flop receive a signal from said means for alternatively inverting.

13. The serial data receiver of claim 11 wherein said serial data receiver provides clock symmetry-based window centering.

14. The serial data receiver of claim 11 wherein said serial data receiver provides delay line-based window centering.

15. The serial data receiver of claim 11, wherein said clock recovery circuit comprises a phase locked loop, and wherein said phase locked loop includes a charge-pump-based phase detector.

16. A serial data receiver for providing synchronized data from a binary input signal, said receiver comprising:

a clock recovery circuit extracting a recovered clock signal from said binary input signal;

a data latch providing a synchronized data signal; and means for selectively inverting said recovered clock signal coupled between said clock recovery circuit and said data latch, wherein said means for selectively inverting comprises an inverting input providing an inverted recovered clock signal during a normal operation mode, a non-inverting input providing a non-inverted recovered clock signal during a de-skew mode, a select input, and an output node, wherein a signal on said select input determines which of said inverted clock signal and said non-inverted clock signal is presented on said output node.

17. The serial data receiver of claim 16 wherein said means for selectively inverting includes a two-input multiplexer.

18. A method of window de-skewing in a serial data receiver, said receiver for providing synchronized data from a binary input signal, said method comprising the steps of:

recovering a clock signal from said binary input signal;

inverting said recovered clock signal;

providing said inverted recovered clock signal to a data latch;

maximizing coincidence of a plurality of input signal pulses and data window boundaries;

reinverting said recovered clock signal; and providing said recovered clock signal to said data latch.

19. The method of claim 18, wherein the step of maximizing coincidence includes observing a bit error rate of the input signal pulses.

20. The method of claim 18, wherein the step of maximizing coincidence further includes adjusting the coincidence to achieve a particular bit error rate.

21. The method of claim 20, wherein the particular bit error rate is approximately 50%.

\* \* \* \* \*

UNITED STATES PATENT AND TRADEMARK OFFICE
CERTIFICATE OF CORRECTION

PATENT NO.    : 5,579,352
DATED         : November 26, 1996
INVENTOR(S)   : William D. Llewellyn It is certified that error appears in the above-identified patent and that said Letters Patent is hereby corrected as shown below:

Col. 5, line 46, delete "or" and insert --of--.

Signed and Sealed this

Twenty-seventh Day of May, 1997

Attest:

BRUCE LEHMAN

Attesting Officer    Commissioner of Patents and Trademarks